March 23, 1965 D. J. LA MOTHE 3,175,100
TRANSISTORIZED HIGH-SPEED REVERSING DOUBLE-POLE-DOUBLE-THROW SWITCHING CIRCUIT
Filed June 7, 1961
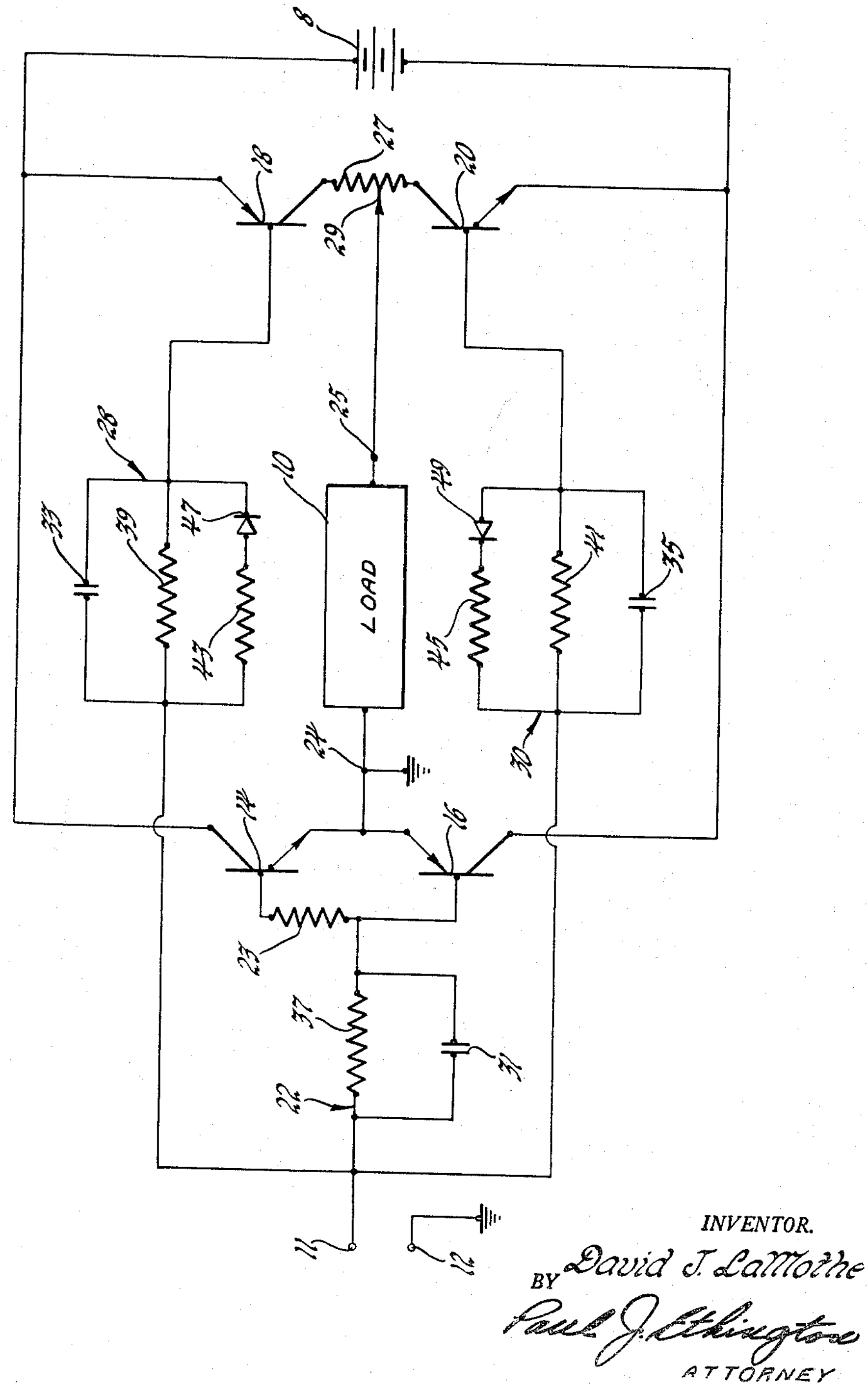
INVENTOR.
David J. LaMothe
BY Paul J. Ethington
ATTORNEY United States Patent Office 3,175,100
Patented Mar. 23, 1965

3,175,100
TRANSISTORIZED HIGH-SPEED REVERSING DOUBLE-POLE-DOUBLE-THROW SWITCHING CIRCUIT

David J. La Mothe, Lafayette, Ind., assignor to General Motors Corporation, Detroit, Mich., a corporation of Delaware Filed June 7, 1961, Ser. No. 115,545
6 Claims. (Cl. 307—88.5)

This invention relates to switching circuits and more particularly to a switching circuit employing complementary transistor pairs to positively and accurately vary an output signal across a load in accordance with signals from an input source.

In accordance with this invention full wave operation is obtained from a single source of direct voltage, the voltage of this source being applied across a load in opposite directions on successive half cycles of an input signal. This is accomplished by two pairs of complementary transistors operated as switches with the signal voltage applied simultaneously to the control electrodes of all the transistors. The invention also provides for positive switching on of transistors by means of circuitry for adding the supply voltage to the signal voltage on the control electrodes of each transistor in a particular transistor pair. Additionally, circuitry is provided to maintain complete cutoff of transistors in spite of leakage current which tends to oppose the cutoff bias, this being accomplished by using asymmetrically conductive networks in the circuit with the control electrodes of a particular transistor pair.

Referring now to the drawing, there is illustrated a particular embodiment of this invention in a circuit which is adapted to control the application of a supply voltage source 8 to a load 10 in accordance with variations of a signal voltage. The circuit includes a pair of input terminals 11 and 12 to which a signal voltage of rectangular waveshape is applied and includes also a first pair of transistors 14 and 20 which are controlled by the signal voltage to become simultaneously conductive to apply the supply voltage 8 to the load 10 during one half cycle of the signal voltage. Similarly, the circuit includes transistors 16 and 18 which are also controlled by the signal voltage to become conductive on the other half cycle of the signal voltage thereby applying the supply voltage 8 to the load 10 in a direction opposite to that of the first half cycle.

It is noted that transistors 14 and 20 are NPN types and are respectively complementary to transistors 16 and 18 which are PNP types. It is further noted that the transistors 14, 16, 18 and 20 are connected in common emitter circuits, that is, the emitter electrode of each transistor is used in both the input and output circuits of that transistor. In this configuration, the emitter electrodes of transistors 14, 16, 18 and 20 are the common electrodes and the base and collector electrodes of the four transistors constitute input and output electrodes, respectively.

Considering the circuit in greater detail, the signal voltage is applied simultaneously to the input circuits of all of the transistors to cause the transistors to be driven to proper states of conduction or nonconduction depending on the polarity of the input terminal 11 with respect to the input terminal 12 which is held at ground potential as shown.

For a PNP type transistor, the nonconductive or "cut-off" condition of the transistor is obtained when the base is at a positive potential relative to the emitter and current conduction between the emitter and collector electrodes is a minimum. The term "cut-off" means that a further increase in the magnitude of the reverse voltage between the base and emitter electrode is ineffective to further decrease current conduction between the emitter and collector electrode. For this condition, the resistance between the emitter and collector electrode is of a relatively large value. The conductive or "on" condition of a PNP transistor is obtained when the base is driven to a negative potential relative to the emitter sufficient to provide a saturated condition of the transistor. The term "saturated" means that a further increase in the magnitude of the forward voltage between the base and emitter electrode has a negligible effect upon the magnitude of current flowing between the emitter and collector electrode. For this condition, the resistance between the emitter and collector electrode is of a relatively small value. The effects of positive and negative base to emitter biases have the reverse effect of that outlined above if applied to an NPN type transistor.

The input circuit of transistor 14, which is operative for positive signal values, extends from the input terminal 11, through the parallel network 22 and the resistor 23 which is included to compenate for any small difference in transistor parameters, through the base and emitter electrodes of transistor 14 to the output terminal 24 and thence through ground to input terminal 12.

The input circuit of transistor 20 which also operates during positive output of the signal source includes the output and common electrodes of transistor 14 and extends from terminal 11 through the parallel circuit 30, the base emitter circuit of transistor 20, the supply voltage 8, the collector-emitter circuit of transistor 14, to the output terminal 24 which is connected by ground to input terminal 12.

The input circuit of transistor 16, which is operative for negative values of signal voltage, extends from terminals 12 to 24 by means of the ground connection, through the emitter and base electrodes of transistor 16 and the parallel network 22, to the input terminal 11.

The input circuit of transistor 18, which is also operative for negative signal value, extends from the input terminal 12 through the ground to the output terminal 24, the emitter to collector circuit of transistor 16, the direct voltage source 8, the emitter to base circuit of transistor 18, the parallel network 28 to the input terminal 11. It can be seen that the input circuit of transistor 18 also includes the output and common electrodes of transistor 16.

A consideration of the output circuits of the transistors 14, 16, 18 and 20 with respect to the supply voltage 8 will now be made. The output circuits of transistors 14 and 20 lie in a common path extending from the positive terminal of the supply voltage source 8 through the collector-emitter electrodes of transistor 14, the load 10, part of resistor 27 having an intermediate tap 29, the collector and emitter electrode of transistor 20 to the negative terminal of the supply source 8. Similarly, the output circuits of transistors 16 and 18 lie in a path extending through the emitter and collector electrode of transistor 18, the load 10, part of resistor 27 as determined by the tap 29, the emitter and collector electrodes of transistor 16 and the supply source 8. The two output paths as defined by the foregoing are alternately operative in accordance with the signal applied to the base electrode of the switching transistors. The variable tap 29 on the resistor 27 permits adjustment of the load current for either equal or unequal current values during operation of the two output paths.

Considering the operation of the circuit in detail, the signal voltage is applied simultaneously to the base electrodes of the transistors. To minimize the switching time of the transistors, paths of low impedance to the vertical pulse portion of the rectangular wave input are provided from the input terminal 11 to the base electrodes of the transistor. These low impedance paths comprise capacitors 31, 33 and 35 in parallel networks 22, 28 and 30, respectively. A pulse which is positive with respect to ground applied to the input terminals 11 and 12 is applied through the capacitors 31, 33 and 35 to the transistor base electrodes whereby the base electrodes of transistors 14 and 20 become positive relative to their respective emitter electrodes causing these transistors to become fully conductive through their collector to emitter circuits thus appearing as closed switches. The transistors 16 and 18 are held at cutoff by the positive signal applied to their base electrodes and appear as open switches. At this point it should be noted that the positive terminal of the supply source 8 is directly connected through the conductive output circuit of the transistor 14, output terminal 24 and the ground connection to the input terminal 12. The supply source 8 is then in series with the signal source and adds directly thereto in the input circuit of transistor 20. This voltage addition acts to insure the complete closing of transistor 20. The supply source 8 is now applied through the series combination of the conductive output circuits of transistor 14 and 20, and the load 10 in such a manner as to make output terminal 24 positive with respect to output terminal 25.

A negative pulse applied to the input terminals 11 and 12 will act in a manner opposite to that described above to cause transistors 16 and 18 to become conductive whereby their emitter to collector circuits appear as closed switches while transistors 14 and 20 become non-conductive across their collector to emitter circuits their appearing as open switches. The negative terminal of the supply voltage 8 is now connected through the conductive output circuit of transistor 16 to the output terminal 24 which is connected through the ground connection to the input terminal 12 thereby placing the supply voltage 8 in series with the signal source. This added voltage applied to the control electrode of transistor 18 acts to insure complete closing of transistor 18. The supply source 8 is now applied through the series combination of the conductive output circuits of transistors 16 and 18 and the load 10 in such a direction as to make the output terminal 25 positive with respect to output terminal 24.

With the input signal positive on terminal 11 with respect to terminal 12, there is some leakage current flowing into the base electrodes of transistors 16 and 18 which are reversed biased at this time. These leakage currents will cause voltage drops across the parallel networks 22 and 28 in such a manner as to cause the base electrodes of the transistors 16 and 18 to become negative. This negative voltage at the base electrodes of transistors 16 and 18 tends to oppose the positive signal voltage and the transistors tend to become conductive. Since the addition of the signal voltage with the supply voltage 8 does not occur on transistor 16 due to the fact that the emitter electrode of transistor 16 is held at the same potential as the input terminal 12, the forward current limiting resistor 37 may be smaller than the resistor 39 such that the voltage drop across resistor 37 due to the leakage current through the base of transistor 16 is limited to a tolerable value. This is also true of transistor 14 during its period of reverse bias. However, with the aforementioned voltage addition on the base electrodes of transistors 18 and 20, the current limiting resistor 39 and 41 must be of such a value to limit forward bias current that they cause an intolerable drop across the parallel circuits 28 and 30 due to leakage current during respective periods of reverse bias of transistors 18 and 20. For this reason diodes 47 and 49 with respective series resistors 43 and 45 are connected to be operative during reverse bias of the transistors 18 and 20 placing the resistor pairs 39–43, and 41–45 in parallel thereby providing a lower resistance in series with the base electrode of transistors 18 and 20 during their respective periods of reverse bias than during periods of forward bias. The voltage drops across networks 28 and 30 due to leakage currents through the base electrodes of transistors 18 and 20 are thereby limited to a tolerable value over a wide range of temperatures and the tendency to turn on these transistors during their respective periods of nonconductivity is minimized.

From the foregoing description it can be seen that the voltage across the output terminals 24 and 25 is an accurate amplification of the rectangular wave input to the terminals 11 and 12.

It is to be understood that the specific embodiment of the invention shown and described herein are illustrative and that various modifications may be made without departing from the scope and spirit of this invention.

I claim:

1. A switching circuit, the combination comprising two pairs of complementary transistors, a source of direct voltage, a pair of input terminals adapted to be connected across a signal voltage source, a pair of output terminals adapted for connection to a load device, each transistor having an input, output and common electrode, the input electrode of each transistor being connected to one of the input terminals, the common electrodes of the first of said transistor pairs being connected to the other input terminal and to one of the output terminals, the output electrodes of the second of said transistor pairs being connected to the other output terminal, the output electrodes of the first of said transistor pairs being connected across the source of direct voltage, and the common electrodes of the second of said transistor pairs being connected across the source of direct voltage.

2. Apparatus for amplifying an alternating voltage wave including two pairs of transistors, the transistors of each pair being of opposite conductivity types, each transistor having a base, emitter and collector, a source of direct voltage, a load device being connected between the emitters and collectors of transistors of like conductivity types, the source of direct voltage being connected between the remaining emitters and collectors of transistors of like conductivity types whereby series circuits are provided through the source of direct voltage, the emitter-collector circuits of transistors of like conductivity types and the load device, means to apply said alternating voltage wave simultaneously to the base electrode of each transistor whereby positive signals render conductive the transistors of one conductivity type and render non-conductive the transistors of the opposite conductivity type and current from said source of direct voltage flows through said load in one direction as determined by the conductive transistors, and whereby negative signals cause the states of transistor conduction to be reversed from that caused by said positive signals and current from said supply of direct voltage flows through said load in the opposite direction.

3. A switching circuit, the combination comprising two pairs of complementary transistors, a source of direct voltage, a pair of input terminals adapted to be connected across a signal voltage source, one of the input terminals being connected to a point of reference potential, a pair of output terminals adapted for connection to a load device, one of the output terminals being connected to the point of reference potential, each transistor having base, emitter and collector electrodes, the base electrodes of the first pair of complementary transistors being commonly connected through a first resistive element to the other of the input terminals, the base electrodes of the second pair of complementary transistors being connected through respective second and third resistive elements to said other input terminal, the emitter electrodes of said first transistor pair being commonly connected to the point of reference potential, a fourth resistive element being connected between the collector electrodes of the second of said transistor pairs and having an intermediate tap connected to the other output terminal, the collector electrodes of the first of said transistor pairs being connected across the source of direct voltage, and the emitter electrodes of the second of said transistor pairs being connected across the source of direct voltage.

4. A switching circuit as defined in claim 3 wherein respective capacitive elements are connected in parallel with the first, second and third resistive elements.

5. A switching circuit as defined in claim 3 wherein a capacitive element is connected in parallel with the first resistive element, two parallel impedance paths are connected across each of the second and third resistive elements, the first impedance path being a capacitive element and the second impedance path comprising a resistive element in series connection with a diode whereby a greater impedance is afforded through the second and third parallel networks in one direction than in the opposite direction.

6. A switching circuit as defined in claim 3 wherein parallel impedance paths are connected across each of the second and third resistive elements, these parallel impedance paths comprising a resistive element in series connection with a diode whereby a greater impedance is afforded through the second and third parallel networks in one direction than in an opposite direction.

References Cited by the Examiner

UNITED STATES PATENTS

| | | | |
|---|---|---|---|
| 2,912,634 | 11/59 | Peoples | 321—44 |
| 3,001,901 | 9/61 | Kaiser et al. | 307—88.5 |

FOREIGN PATENTS

| | | |
|---|---|---|
| 1,098,034 | 1/61 | Germany. |

JOHN W HUCKERT, *Primary Examiner.*

HERMAN KARL SAALBACH, *Examiner.*